(12) United States Patent
Dedic (10) Patent No.: US 10,090,936 B2
(45) Date of Patent: Oct. 2, 2018

(54) INTEGRATED CIRCUITRY SYSTEMS

(71) Applicant: SOCIONEXT INC., Yokohama-shi, Kanagawa (JP)

(72) Inventor: Ian Juso Dedic, Middlesex (GB)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 15/456,289

(22) Filed: Mar. 10, 2017

(65) Prior Publication Data

US 2017/0264375 A1 Sep. 14, 2017

(30) Foreign Application Priority Data

Mar. 11, 2016 (EP) ..................................... 16160037

(51) Int. Cl.
*H04B 14/04* (2006.01)
*H01L 25/065* (2006.01)
*H04L 12/863* (2013.01)
*G06F 13/40* (2006.01)

(52) U.S. Cl.
CPC ....... *H04B 14/042* (2013.01); *G06F 13/4072* (2013.01); *G06F 13/4086* (2013.01); *H01L 25/0655* (2013.01); *H04L 47/6295* (2013.01); *H01L 2224/16225* (2013.01); *H01L 2924/15192* (2013.01); *H01L 2924/15311* (2013.01);
(Continued)

(58) Field of Classification Search
CPC .................................................. H01L 25/0655
See application file for complete search history.

(56) References Cited

U.S. PATENT DOCUMENTS 5,864,584 A * 1/1999 Cao ..................... G06F 13/4072
326/30
6,184,717 B1 * 2/2001 Crick ............... H03K 19/00346
326/21
(Continued)

FOREIGN PATENT DOCUMENTS

| EP | 2 211 468 A1 | 7/2010 |
| EP | 2 849 345 A1 | 3/2015 |
| WO | WO 2011/025557 A1 | 3/2011 |

OTHER PUBLICATIONS

Extended European Search Report of related European Patent Application No. 16160037.4 dated Sep. 19, 2016.

*Primary Examiner* — Caridad Everhart
*Assistant Examiner* — Ankush Singal
(74) *Attorney, Agent, or Firm* — Arent Fox LLP (57) ABSTRACT

There is disclosed herein a circuitry system comprising first and second IC chips, configured or configurable such that; the first IC chip has an output terminal connected to receive an output signal from an output-signal unit of the first IC chip, the output-signal unit being connected between high and low voltage-reference sources of the first IC chip, the high and low voltage-reference sources being connected to respective high and low voltage-reference terminals of the first IC chip; and the second IC chip has an input terminal connected in a potential-divider arrangement between high and low voltage-reference terminals of the second IC chip, wherein: the high and low voltage-reference terminals of the first IC chip are respectively connected to the high and low voltage-reference terminals of the second IC chip; and the output terminal of the first IC chip is connected to the input terminal of the second IC chip.

17 Claims, 7 Drawing Sheets

(52) U.S. Cl.
CPC .... *H01L 2924/16152* (2013.01); *Y02D 10/14* (2018.01); *Y02D 10/151* (2018.01)

(56) References Cited

U.S. PATENT DOCUMENTS

| | | | | |
|---|---|---|---|---|
| 6,304,098 B1* | 10/2001 | Drost | ........................ | H04L 5/20 326/26 |
| 6,453,422 B1* | 9/2002 | Dabral | .............. | H04L 12/40032 307/147 |
| 6,972,597 B2* | 12/2005 | Kim | ...................... | H04L 5/1423 326/21 |
| 7,242,339 B1* | 7/2007 | Truong | .............. | H03K 17/6872 341/154 |
| 9,818,470 B2* | 11/2017 | Best | ..................... | G11C 11/4093 |
| 2004/0057525 A1* | 3/2004 | Rajan | .................. | G06F 13/4072 375/257 |
| 2006/0181303 A1* | 8/2006 | Dreps | ................. | G06F 13/4072 326/29 |
| 2007/0268047 A1* | 11/2007 | Hopkins | ........... | H04L 25/03878 327/111 |
| 2009/0176450 A1* | 7/2009 | Chow | ..................... | H01L 23/48 455/41.1 |
| 2010/0127758 A1* | 5/2010 | Hollis | ...................... | G11C 5/02 327/526 |
| 2012/0057261 A1* | 3/2012 | Poulton | ................... | H04B 3/54 361/56 |
| 2012/0151247 A1* | 6/2012 | Ferraiolo | .................. | H04L 1/22 714/4.5 |
| 2012/0176156 A1* | 7/2012 | Chang | ................. | H04L 25/0278 326/62 |
| 2013/0080815 A1* | 3/2013 | Sutherland | ................ | G06F 1/12 713/400 |
| 2013/0159761 A1* | 6/2013 | Baumgartner | ............ | H04L 1/22 714/4.5 |
| 2014/0118372 A1* | 5/2014 | Hung | ................... | G09G 3/2096 345/532 |

* cited by examiner

INTEGRATED CIRCUITRY SYSTEMS

CROSS-REFERENCE TO RELATED APPLICATIONS

This application claims priority to European Patent Application No. 16160037.4, filed Mar. 11, 2016. The disclosure of the priority application is incorporated in its entirety herein by reference.

The present invention relates to integrated circuitry systems, and in particular to multi-chip circuitry systems.

The present invention relates in particular to systems for enabling a high-speed (high data rate) connection, link or interface between integrated circuits such as may be provided on separate IC chips. That is, different sets of integrated circuitry may be disposed on different IC chips, and the present invention considers how to transmit a signal from one such chip to another. Such chips are examples of integrated circuits, and as such the present invention considers how to transmit a signal from one such integrated circuit to another.

Figure 1:
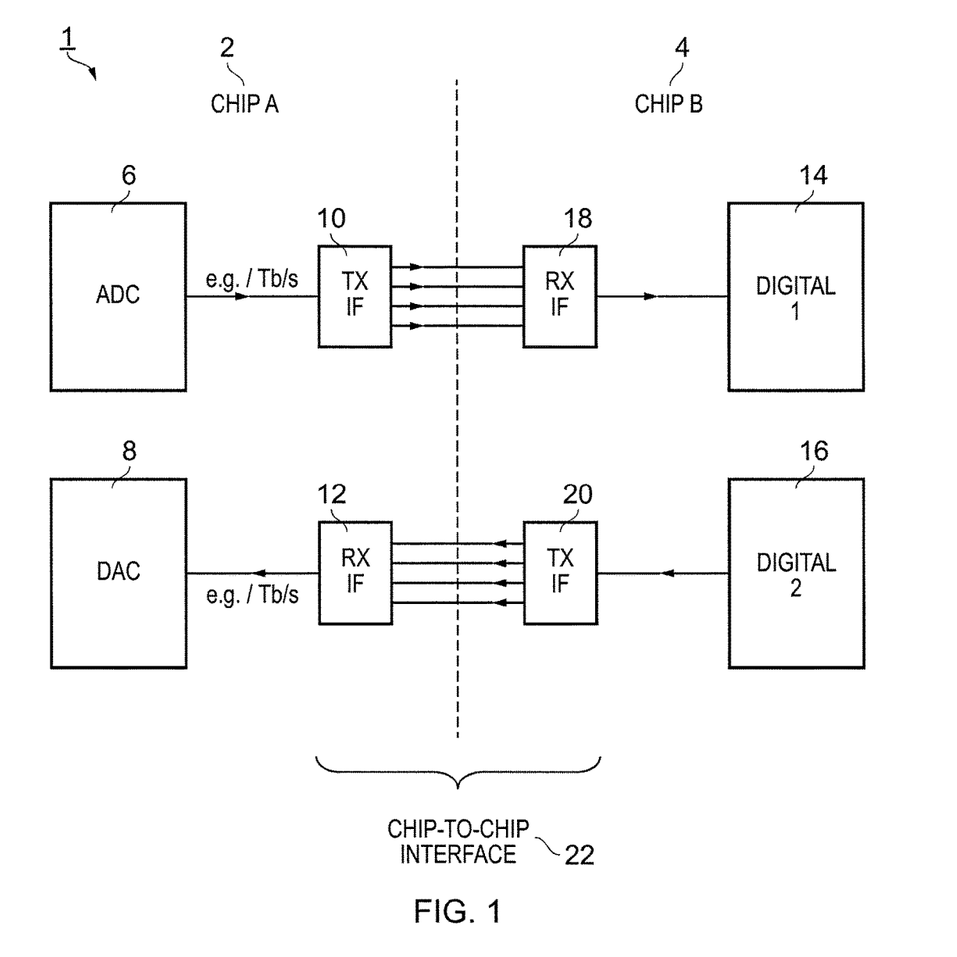
FIG. 1, as discussed above, presents a schematic diagram of a previously-considered circuitry system.

As an example, FIG. 1 presents a schematic diagram of a previously-considered circuitry system 1. Circuitry system 1 comprises a chip A 2 and a chip B 4. Chip A 2 comprises an analogue-to-digital convertor (ADC) unit 6, a digital-to-analogue convertor (DAC) unit 8, a transmission interface 10 and a reception interface 12. Chip B 4 comprises a first digital unit 14, a second digital unit 16, a reception interface 18 and a transmission interface 20.

As indicated in FIG. 1, the ADC unit 6 is configured and connected to output a digital signal via the transmission interface 10 and the reception interface 18 to the first digital unit 14. Conversely, the second digital unit 16 is configured and connected to output a digital signal via the transmission interface 20 and the reception interface 12 to the DAC unit 8. Also as indicated in FIG. 1, the transmission and reception interfaces 10, 12, 18 and 20 and the connections therebetween may be referred to collectively as a chip-to-chip interface 22.

Such a system provides a link between a chip A having ADC and/or DAC circuitry and a chip B having digital circuitry. Clearly this is just an example, and the circuitry in the two chips may be any sets of circuitry which need to send a signal one to the other, such as two sets of digital circuitry. As indicated in FIG. 1, the link (and the interface 22) may be in both directions, but it may also be in either direction, i.e. from chip A to chip B (only) or vice versa.

Continuing the FIG. 1 example, the link between the mixed-signal circuitry (DAC or ADC) and the digital circuitry may be readily implemented on-chip, when both sets of circuitry are provided on the same chip. However, difficulties arise when, for example, the digital circuitry needs to be provided on a different chip from the mixed-signal circuitry, e.g. to allow for the use of two different fabrication process technologies or simply to connect two different chips.

Examples of ADC circuitry to which the present invention may be applied are found in EP2211468, the entire contents of which are incorporated herein by reference. Examples of DAC circuitry to which the present invention may be applied are found in EP2849345, the entire contents of which are incorporated herein by reference. Taking the circuitry of EP2211468 as an example, the ADC unit 6 may for example be an 8 b 128 Ms/s ADC outputting data at around 1 Tb/s (e.g. 1024 b @ 1G Hz). The DAC unit 8, e.g. adopting the circuitry of EP2849345, may also handle (input) data at around 1 Tb/s.

Figure 2:
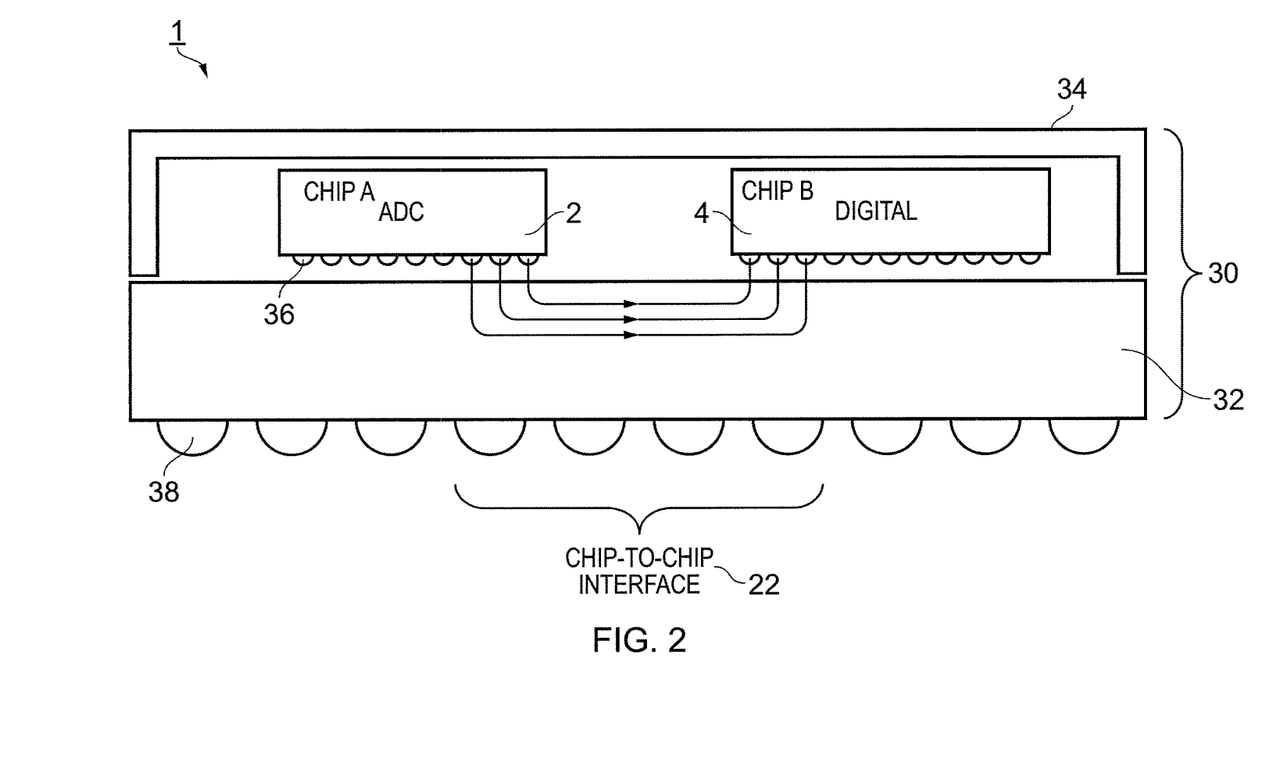
FIG. 2, as discussed above, is another schematic diagram of the circuitry system of FIG. 1.

FIG. 2 is another schematic diagram of circuitry system 1, indicating that it may be implemented as flip chips inside a flip-chip package.

System 1 of FIG. 2 comprises a flip-chip package 30, the flip-chip package 30 comprising a substrate 32 on which the chips (implemented as flip chips) A 2 and B 4 are mounted, and a protective lid 34.

The flip chips 2 and 4 may have for example "normal" bumps (typically at 150 μm pitch) or "micro bumps" (typically at 50 μm pitch). The link or interface 22 may be implemented as connections in the package 30, or more particularly via the substrate 32. It should be noted that in the example of FIG. 2 it is assumed that the chip A 2 has multiple ADC units 6, each referred to as an ADC channel. For example, chip A 2 may have up to 16 such channels each requiring a 1 Tb/s connection to chip B 4. Each channel may have only 32 bumps available, which limits how the interface 22 may be implemented.

It is desirable to solve one or more of the above problems, in particular to implement a link between chips which is efficient. It is desirable for such a link to enable such high data rates with low power consumption. It is desirable to use available external connections or "bumps" efficiently.

According to an embodiment of a first aspect of the present invention, there is provided a circuitry system comprising first and second IC chips. Such a system, or the chips thereof, is configured or configurable such that the first IC chip has an output terminal connected to receive an output signal from an output-signal unit of the first IC chip, the output-signal unit being connected between high and low voltage-reference sources of the first IC chip, the high and low voltage-reference sources being connected to respective high and low voltage-reference terminals of the first IC chip. Such a system, or the chips thereof, is configured or configurable such that the second IC chip has an input terminal connected in a potential-divider arrangement between high and low voltage-reference terminals of the second IC chip.

The high and low voltage-reference terminals of the first IC chip may be respectively connected to the high and low voltage-reference terminals of the second IC chip, and the output terminal of the first IC chip may be connected to the input terminal of the second IC chip for transmission of the output signal from the first IC chip to the second IC chip.

The high and low voltage-reference terminals of the first IC chip may be respectively connected to the high and low voltage-reference terminals of the second IC chip so that the high and low voltage-reference sources of the first IC chip are respectively connected to the high and low voltage-reference terminals of the second IC chip as voltage-reference sources therefore. That is, the voltage-reference sources of the first IC chip may maintain respective voltage levels at the high and low voltage-reference terminals of the first IC chip, and control the high and low voltage-reference terminals of the second IC chip.

For example, the high and low voltage-reference terminals of the second IC chip may be separate (i.e. electrically, or conductively) from any voltage-reference sources of the second IC chip itself, so that they are effectively supplied or powered from the first IC chip. That is, currents which circulate via the high and low voltage-reference terminals of the second IC chip are supplied from the first IC chip (via its voltage-reference sources), rather than from the second IC chip. That is, the currents which circulate via the high and low voltage-reference terminals of the second IC chip may be independent of currents generated by voltage-reference sources (e.g. a power supply unit) of the second IC chip. Put another way, current paths passing through the potential-divider arrangement may be closed in the sense that currents caused to flow along those paths are both sourced and sunk in the first IC chip, rather than in the second IC chip. Current paths (all current paths) which pass through said potential-divider arrangement may extend from the high voltage-reference source of the first IC chip to the low voltage-reference source of the first IC chip, forming closed current loops supplied by the first IC chip. As such, the high and low voltage-reference terminals of the second IC chip may be considered high and low voltage-reference "input" terminals.

With this in mind, the input terminal of the second IC chip may be connected to an input terminal (having high input impedance) of an input buffer of the second IC chip, via which an internal signal of the second IC chip may be generated based upon the output signal received at the input terminal of the second IC chip from the first IC chip. Such an input buffer may afford separation between currents which circulate via the high and low voltage-reference terminals of the second IC chip and any currents generated by voltage-reference sources (e.g. a power supply unit) of the second IC chip.

Such a system has the advantage that signals can be transmitted between such chips whilst only requiring one signal-line connection per signal. The connections between the voltage-reference terminals and the potential-divider arrangement allow the circulation of currents across the interface between the two chips (supplied from the first IC chip), enabling data-independent power consumption as discussed in more detail below.

The output-signal unit may be a signal buffer, for example comprising or being a CMOS inverter. Such CMOS inverters enable low power operation.

The output-signal unit and potential-divider arrangement may be configured such that the resistance they present (together) between the high and low voltage-reference sources is substantially the same when the output signal has a logic low value as when it has a logic high value. This has the advantage of enabling data-independent power consumption, since the same current is drawn from a power supply unit in the first IC chip irrespective of the signal level (logic high or logic low).

The output-signal unit may be configured to present a first on resistance between the high voltage-reference source and the output terminal when the output signal has the logic high value and to present a second on resistance between the low voltage-reference source and the output terminal when the output signal has the logic low value, with the first and second on resistances being substantially the same as one another.

The potential-divider arrangement may be configured to present a first potential-divider resistance between the high voltage-reference source and the input terminal and to present a second potential-divider resistance between the low voltage-reference source and the input terminal, with the first and second potential-divider resistances being substantially the same as one another.

The output-signal unit may be configured to output the output signal as a switched logic level signal such as a digital (e.g. data) signal, which signal may be configured to switch between the voltage levels of the high and low voltage-reference sources. However, it will be appreciated that analogue signals such as sinusoidal (raised cosine) signals may also be considered to switch between logic high and logic low values, and the present disclosure will be considered accordingly.

The output signal may be a single-ended signal, requiring only one signal line. This helps keep the number of signal lines required to transmit multiple such signals relatively low. The system may be configured or configurable such that the output terminal of the first IC chip is connected to the input terminal of the second IC chip via a transmission line connection (i.e. having a transmission line). Such a transmission line connection may comprise a transmission line, serving as such a signal line. For purposes of matching, the input impedance of such a transmission line may be equal to the on-resistances of the output-signal unit. The first and second potential-divider resistances may each have a resistance twice the input impedance of the transmission line.

The system may be configured or configurable such that the output signal is transmitted from the first IC chip to the second IC chip via only the single connection between the output terminal of the first IC chip and the input terminal of the second IC chip.

The first IC chip may comprise analogue-to-digital converter circuitry, the output signal being a digital signal output from the analogue-to-digital converter circuitry, and the second IC chip may comprise digital circuitry configured to operate in dependence upon that digital signal. The first IC chip may comprise digital circuitry, the output signal being a digital signal output from the digital circuitry, and the second IC chip may comprise digital-to-analogue converter circuitry configured to operate in dependence upon that digital signal. Both possibilities may be provided in parallel (i.e. with two signal lines), or on a time-share basis with the input and output terminals being configurable as output and input terminals, respectively, and connectable to the relevant circuitry blocks in their chips. The present disclosure will be interpreted to extend to such chips which may be configured (i.e. that are configurable) in this manner.

The first and second IC chips may be configured or configurable such that they have a plurality of said output terminals and input terminals.

For example, the first and second IC chips may be configured or configurable such that: each said output terminal is connected to receive a corresponding output signal from a corresponding output-signal unit of the first IC chip; each said output-signal unit is connected between said high and low voltage-reference sources of the first IC chip; and each said input terminal is connected in a potential-divider arrangement between said high and low voltage-reference terminals of the second IC chip, wherein each said output terminal of the first IC chip is connected to a corresponding said input terminal of the second IC chip for transmission of its corresponding output signal from the first IC chip to the second IC chip. As such, multiple signals may be transmitted with the overall link sharing the same high and low voltage-reference terminals.

The system may be referred to as a flip-chip package, wherein said first and second IC chips are flip chips of the flip-chip package.

According to an embodiment of a second aspect of the present invention, there is provided mixed-signal circuitry (involving analogue-to-digital or digital-to-analogue conversion), comprising a circuitry system of the aforementioned first aspect of the present invention.

The present disclosure extends to method aspects corresponding to the apparatus aspects.

Reference may now be made, by way of example, to the accompanying drawings, of which.

Figure 3:
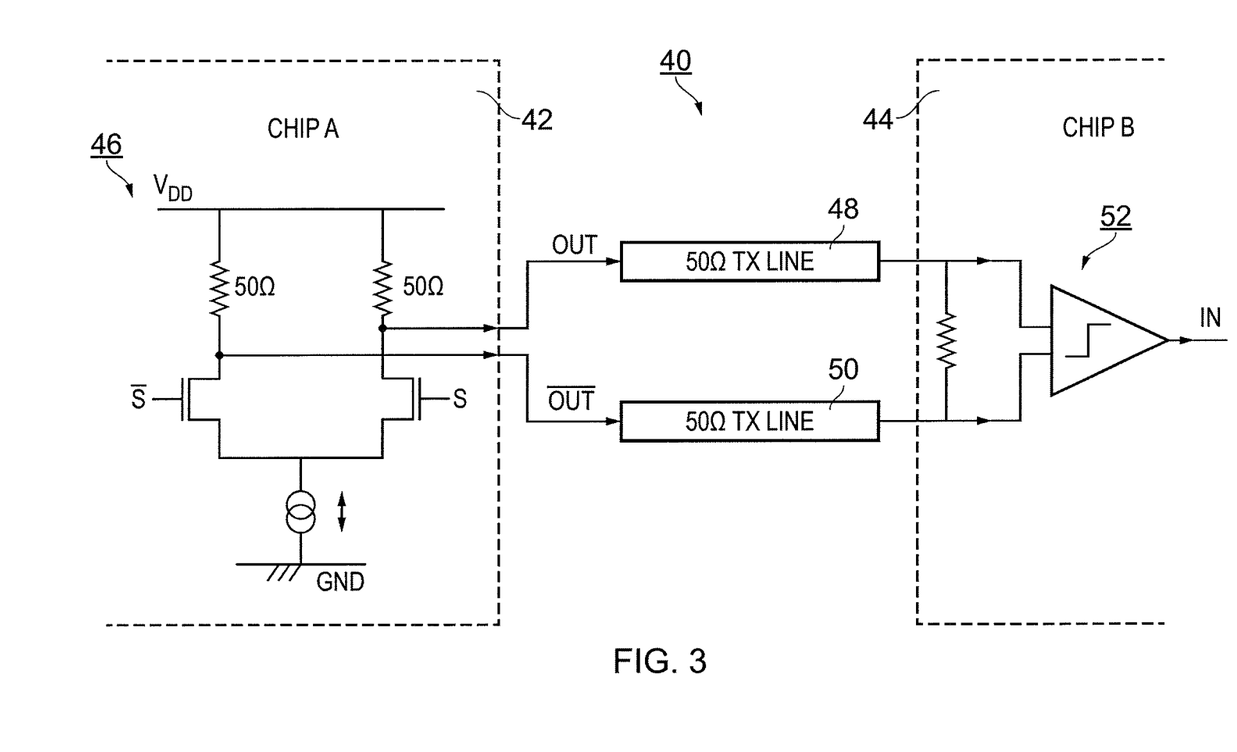
FIG. 3 is a schematic diagram of a previously-considered circuitry system.
Figure 4:
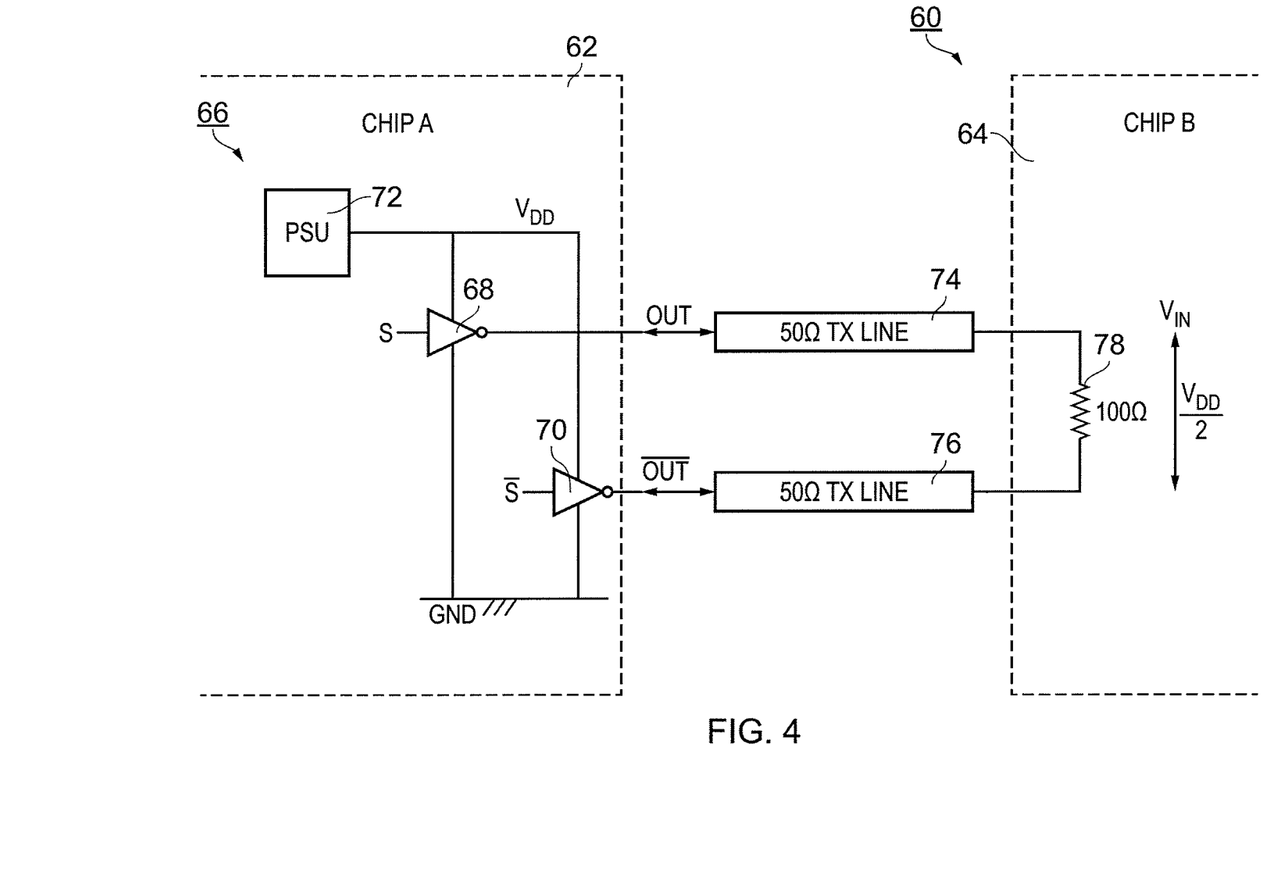
FIG. 4 is a schematic diagram of a previously-considered circuitry system.

Before moving on to embodiments of the present invention, FIGS. 3 and 4 are provided for comparison purposes.

FIG. 3 is a schematic diagram of a previously-considered circuitry system 40, in which a known serial de-serial (SERDES) transmitter is adopted.

System 40 comprises chips A 42 and B 44 corresponding respectively to chips A and B in FIGS. 1 and 2. For simplicity, both here and in the embodiments disclosed later herein, focus is taken off exactly which circuitry units (DAC, ADC, and digital, etc.) are in the two chips A and B and is placed mainly on the interface between the chips (i.e. corresponding to interface 22 in FIGS. 1 and 2). In this respect, the circuitry shown in FIG. 3 could be considered to correspond to such a link or interface.

Chip A 42 comprises (SERDES) transmission circuitry 46, configured to take differential input signals S and /S and to output corresponding output signals OUT and /OUT as indicated. In the present example, these signals OUT and /OUT are transmitted via 50Ω (ideally, lossless) transmission lines 48 and 50 to corresponding reception circuitry 52 in chip B 44, which employs a comparator buffer to arrive at input signal IN which is input to a circuitry unit (not shown) in chip B 44 operable dependent upon that input signal.

It will be appreciated that the link of circuitry system 40 is differential, requiring two signal lines or wires (transmission lines 48 and 50) per signal transmitted between chips A42 B44. Although the link or interface is a constant current link, assuming the transmission of switched logic level signals (such as digital signals, which could be data, control or clock signals), it is a relatively high-power link given for example the power dissipated in the transmitter.

FIG. 4 is a schematic diagram of previously-considered circuitry system 60 which corresponds to the circuitry system 40 of FIG. 3 but which employs a lower-power transmitter.

Circuitry system 60 comprises chips A 62 and B 64, corresponding respectively to chips A and B in FIGS. 1 to 3. Chip A 62 comprises transmission circuitry 66, configured to take differential input signals S and /S and to output corresponding output signals OUT and /OUT as indicated. The transmission circuitry 66 comprises first and second buffers 68 and 70 (for signals S and /S, respectively) connected to receive power from the explicitly shown power supply unit (PSU) 72.

These buffers 68 and 70 may be implemented as simple CMOS inverters, with for example their on resistance $R_{ON}$=50 Ω, matching the impedance of the transmission lines 74 and 76 used to transmit the signals OUT and /OUT to chip B 64. The receiver circuitry in chip B 64 comprises, in this example, a 100Ω resistor 78 between the two transmission lines 74 and 76 at the input to chip B 64, generating a VDD/2 swing in the input signal voltage $V_{IN}$ as indicated. This of course assumes that the transmitted signals OUT and /OUT are switched logic level signals such as digital data signals as mentioned above, which switch in logic level between logic high (or VDD) and logic low (or ground, GND).

As mentioned above, the interface circuitry of FIG. 4 may be configured to operate at relatively low power, given the CMOS buffers 68 and 70 at the transmission side and the potential to lower VDD to for example around 0.2V. Also, such an interface enables constant current draw from the PSU 72, but, as in FIG. 3, requires two signal lines (transmission lines 74 and 76) per signal transmitted between chips A 62 and B 64.

Figure 5A:
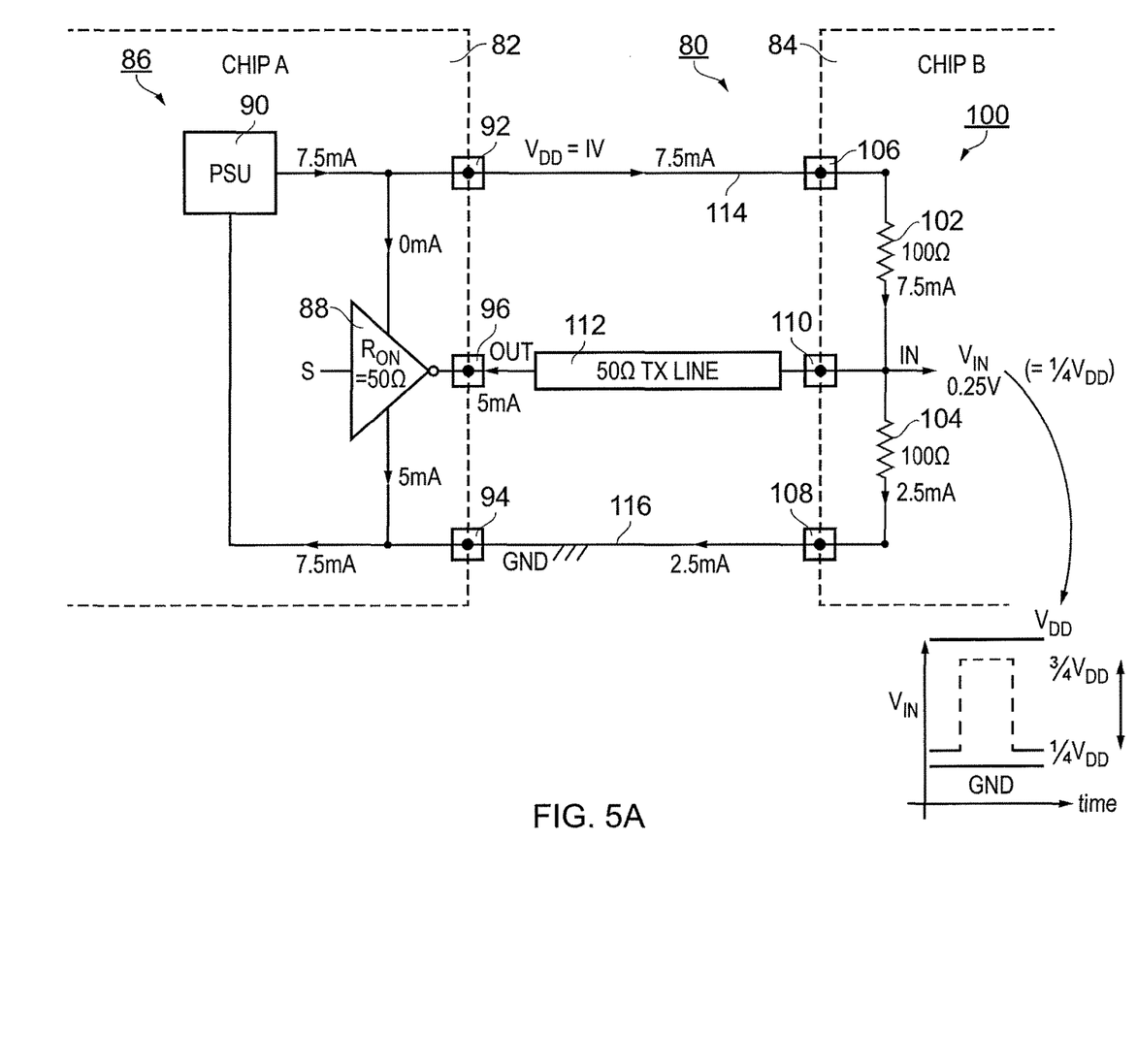
FIGS. 5A and 5B are schematic diagrams of a circuitry system embodying the present invention.
Figure 5B:
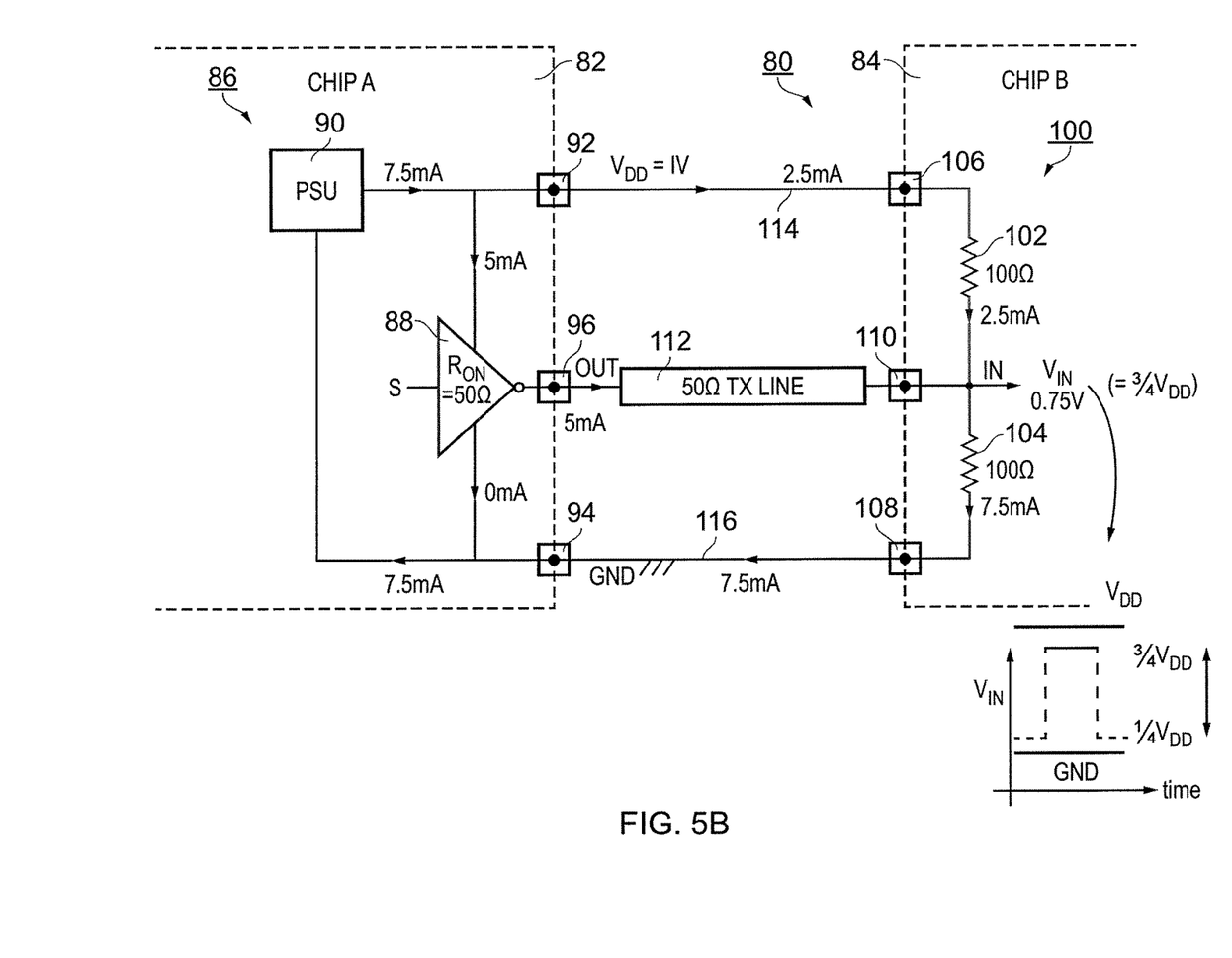

FIGS. 5A and 5B present schematic diagrams of a circuitry system 80 embodying the present invention. It will become apparent that FIGS. 5A and 5B present the same circuitry system 80 but under different signal conditions.

Circuitry system 80 comprises chips A 82 and B 84 which correspond respectively to chips A and B in FIGS. 1 to 4. However, the chip-to-chip interface or link of circuitry system 80 is considered advantageous when compared to those of systems 40 and 60.

Chip A 82 comprises transmission circuitry 86, configured to take single-ended signal S and to output a corresponding single-ended output signal OUT as indicated. The transmission circuitry 86 comprises a buffer 88 connected to receive power from the PSU 90. That is, buffer 88 is connected between logic high (VDD) and logic low (ground, or GND) voltage reference sources provided by the PSU 90. Buffer 88 may be implemented as an inverter such as a CMOS inverter, for its low power advantages (e.g. no static current—in that the buffer itself consumes no current on top of the output current needed to drive the signal line and the far-end termination), with its on resistance $R_{ON}$=50Ω, for example as mentioned above.

At this juncture, it is noted that the various components, voltages and currents in FIGS. 5A and 5B are given example values to assist in an understanding of the function of the circuitry of system 80, and thus embodiments of the present invention in general. However, these values are only examples and other values are of course possible.

The chip A 82 also comprises a high voltage-reference terminal 92, a low voltage-reference terminal 94 and an output terminal 96. The output of the buffer 88 is connected to the output terminal 96 so as to provide the output signal OUT thereto. The PSU 90 is connected to the high and low voltage-reference terminals 92 and 94 so as to connect the high and low voltage-reference sources VDD and GND thereto, respectively.

The chip B 84 has a potential-divider arrangement 100 serving as reception circuitry, the potential-divider arrangement 100 having a first potential-divider resistance 102 and a second potential-divider resistance 104. The chip B 84 also comprises a high voltage-reference terminal 106, a low voltage-reference terminal 108 and an input terminal 110.

Incidentally, the resistances 102 and 104 could of course be realised as "ON" MOS transistors (active devices in the resistive region). Such transistors would behave as resistors (V=I*R) even though they are not built with resistive material as such. The present disclosure will be understood accordingly.

The first potential-divider resistance 102 is connected between the high voltage-reference terminal 106 and the input terminal 110, and the second potential-divider resistance 104 is connected between the low voltage-reference terminal 108 and the input terminal 110, thus forming the potential-divider arrangement 100. The input signal IN is provided at the input terminal 110.

The circuitry system 80 also comprises a signal line 112 connected between the output terminal 96 of the chip A82 and the input terminal 110 of the chip B84, a signal line 114 connected between the high voltage-reference terminal 92 of chip A and the high voltage-reference terminal 106 of chip B, and a signal line 116 connected between the low voltage-reference terminal 94 of chip A and the low voltage-reference terminal 108 of chip B. The signal line 112 is implemented as a transmission line, in the present running example as a 50Ω (ideally, lossless) transmission line. The signal lines 114 and 116 serve as high and low voltage-reference connections between the chips A and B. These signal lines 114 and 116 may be implemented as reference planes to be low impedance (inductance) compared to the signal tracks (e.g. signal line 112) to prevent coupling between multiple such signal tracks (e.g. data wires) due to common impedance. The presence of such multiple signal tracks is explored in FIG. 6 below.

Note that FIG. 5B is labeled in the same way as FIG. 5A for ease of comparison.

Although parts of the FIGS. 5A and 5B circuitry 80 are similar to those of FIG. 4, note that there is only a single signal wire (transmission line) 112 per signal S, that the VDD and GND planes 114 and 116 are linked between the two chips 82 and 84 and that the input to chip B 84 is connected to the VDD and GND planes 114 and 116 between the two resistors 102 and 104, forming the potential-divider arrangement 100. Note also that, as described below, current which flows through the resistances 102 and 104 flows through closed current loops which originate in chip A 82, i.e. such that the current is sourced and sunk in chip A 82 (i.e. at PSU 90). That is, the resistances 102 and 104 form part of current paths which pass through terminals 92/94/96 and ultimately through PSU 90. Those paths are independent (conductively separate) from any current paths of chip B 84 for which their currents are sourced and sunk in chip B 84.

For simplicity of explanation, it is assumed that VDD=1V and that the two resistors 102 and 104 are 100Ω resistors as indicated.

When the buffer 88 output of chip A 82 is pulled to logic low or GND as in FIG. 5A, 7.5 mA is drawn from the power supply unit 90 in chip A 82, across the VDD plane 114 between the two chips 82 and 84 and down through the upper (first) 100Ω resistor 102 in chip B 84. This current then splits, with 5 mA passing back to chip A 82 via the transmission line 112 and buffer 88, and 2.5 mA passing back to chip A82 via the lower (second) 100Ω resistor 104 and the GND plane 116 between the two chips 82 and 84.

The reverse situation, when the buffer 88 output of chip A 82 is pulled to logic high or VDD is shown in FIG. 5B. In this case, 7.5 mA is drawn from the power supply unit 90 in chip A 82 but this current splits with 2.5 mA flowing across the VDD plane 114 between the two chips 82 and 84 and down through the upper (first) 100Ω resistor 102 in chip B 84 and 5 mA flowing through the buffer 88 and via the transmission line 112 to the input terminal 110 in chip B 84. The summed 7.5 mA then flows through the lower (second) 100Ω resistor 104 and the GND plane 116 between the two chips 82 and 84 back to chip A 84.

A number of features of this circuitry system 80 may seem counter-intuitive.

Firstly, the link or interface is single-ended i.e. only a single signal line 112 (transmission line) per signal link is needed rather than two lines or wires per link as in the differential link as in the differential link of FIGS. 3 and 4. A single-wire link can be accommodated by designing sufficient separation/shielding between adjacent signal-wire links. Such links may be relatively short, e.g. under 5 mm as between flip chips in a flip chip package.

Secondly, the circuitry system 80 assumes the allowance of varying VDD and GND currents, and currents circulating back to PSU 90. In the example of FIGS. 5A and 5B, it could be considered that there is 5 mA DC±2.5 mA AC current flowing in the VDD and GND planes 114 and 116 per link. These reference planes 114 and 116 could be dedicated "link" reference planes separate from the actual VDD and GND planes of one or both of chips A 82 and B 84.

Figure 6:
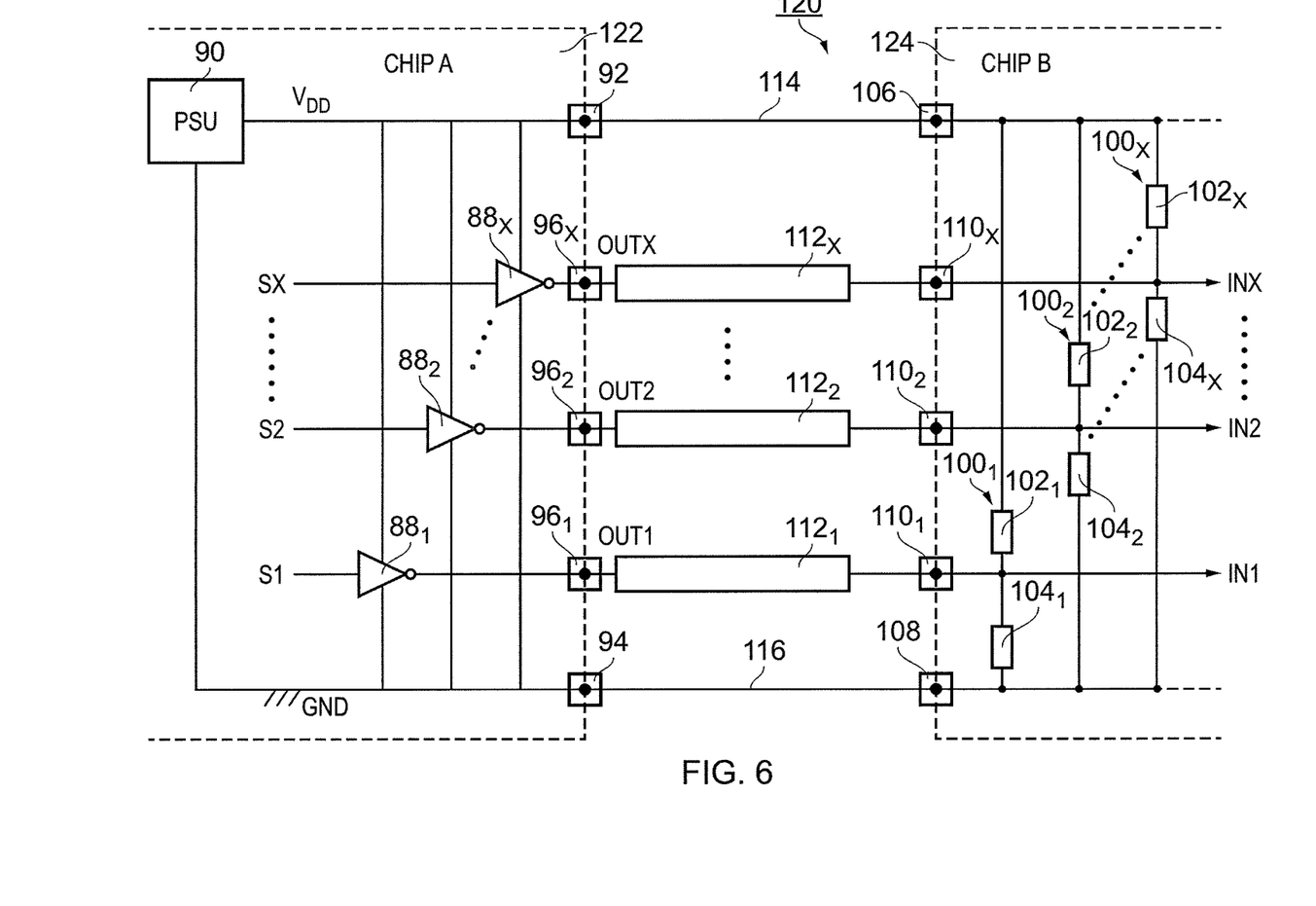
FIG. 6 is a schematic diagram of a circuitry system embodying the present invention.

Note that only one signal link is shown, i.e. for one signal set S-OUT-IN. Others could share the same VDD and GND planes 114 and 116 and power supply unit 90 as shown in FIG. 6 and described below. Note also that in both of FIGS. 5A and 5B 7.5 mA is drawn from the power supply unit 90 in chip A82. That is, the link is constant power, affording data-independent power consumption which is advantageous from a noise point of view.

As indicated in FIGS. 5A and 5B, the receiving side experiences a voltage swing between ¼ and ¾ VDD based on the selections of component values in those Figures, and this signal could be fed into a buffer comparator (not shown) along with a reference ½ VDD signal (not shown) supplied (in common to the or all of the signal links) from chip A 82 to chip B 84. The swing between ¼ and ¾ VDD is indicated by way of the graphs for the input voltage $V_{IN}$ of the input signal IN in FIGS. 5A and 5B.

It will be appreciated that, as compared to the circuitry system 60 of FIG. 4, the circuitry system 80 of FIGS. 5A and 5B has various advantages. For example, it has half the power consumption per signal link and half the number of wires per signal link.

With the example of VDD=1 V, and 7.5 mA/wire (assuming 32 Gb/s per wire, 30 ps period, a propagation time of delay Tprop of 6 ps/mm, and a link length L=3 mm given a 36 ps round trip) and assuming 32 links each with one wire (to provide a 1 Tb/s interface), this equates to 240 mA for the overall 1 Tb/s link and power consumption of 240 mW. However, VDD could be reduced to for example 0.2 V leading to 1.5 mA/wire and 48 mA and 9 mW for the overall 1 Tb/s link. This equates to around 10 fJ/bit/sec, which is very low power.

The range of the present link is considered suitable for an approximately 3 mm link between chip A 82 and B 84, for example in the case that they are implemented as flip chips in a flip-chip package in line with FIG. 2.

FIG. 6 is a schematic diagram of a circuitry system 120, embodying the present invention. It will be appreciated that the circuitry system 120 is closely similar to the circuitry system 80 of FIGS. 5A and 5B, and is provided simply to demonstrate that multiple signal links may be provided together, sharing the same reference planes as mentioned above. Accordingly, where possible, elements of circuitry system 120 are denoted in the same manner as their counterparts in circuitry system 80, and duplicate description is omitted.

Circuitry system 120 of FIG. 6 comprises chips A 122 and B 124 corresponding respectively to chips A 82 and B 84 of circuitry system 80 of FIGS. 5A and 5B.

The main difference between circuitry system 120 and circuitry system 80 is that a plurality (X, where X is an integer) of signals S1 to SX are transmitted as corresponding output signals OUT1 to OUTX via corresponding buffers $88_1$ to $88_x$. As such, corresponding output terminals $96_1$ to $96_x$, signal lines (transmission lines) $112_1$ to $112_x$, input terminals $110_1$ to $110_x$ and potential-divider arrangements $100_1$ to $100_x$ (having corresponding first resistances $102_1$ to $102_x$ and second resistances $104_1$ to $104_x$) are provided, so as to input corresponding input signals IN1 to INX to chip B 124. Note that (only) one set of reference planes 114 and 116 is provided in common to the plurality of signal links, i.e. that no proliferation in reference planes is needed.

As mentioned above, the 100Ω resistors in FIGS. 5A and 5B could be implemented as transistors or (e.g. poly, diffusion) resistors. An advantage of using transistors is that the link could be designed as a programmable bi-directional link, with an appropriate network of transistors and control signals. Additionally, by using a network of transistors, $R_{ON}$ calibration would also be possible.

It will be appreciated that the IC chips disclosed herein may be considered to be examples of integrated circuits, for example with a plurality provided together as a multi-chip module or as a hybrid integrated circuit or as a system-in-a-package. It will also be appreciated that the present invention could in some embodiments be applied within a single IC chip. In this context, the first and second IC chips mentioned above could be referred to as first and second integrated-circuit portions, for example both provided on the same IC chip, and the terminals could be referred to as circuitry nodes. The above disclosure may be understood accordingly.

It will also be appreciated that the circuitry disclosed herein could be described as a DAC or ADC or mixed-signal system. The IC chips disclosed herein may be flip chips. The present invention extends to integrated circuitry and IC chips as mentioned above, flip-chip packages, circuit boards comprising such IC chips or flip-chip packages, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A circuitry system comprising first and second IC chips, configured or configurable such that:
   the first IC chip has an output terminal connected to receive an output signal from an output-signal unit of the first IC chip, the output-signal unit being connected between high and low voltage-reference sources of the first IC chip, the high and low voltage-reference sources being connected to respective high and low voltage-reference terminals of the first IC chip; and
   the second IC chip has an input terminal connected in a potential-divider arrangement between high and low voltage-reference terminals of the second IC chip,
   wherein:
   the high and low voltage-reference terminals of the first IC chip are respectively connected to the high and low voltage-reference terminals of the second IC chip;
   the output terminal of the first IC chip is connected to the input terminal of the second IC chip for transmission of the output signal from the first IC chip to the second IC chip;
   the potential-divider arrangement is configured or configurable to comprise a first potential-divider resistance which extends from the high voltage-reference terminal of the second IC chip to the input terminal of the second IC chip and a second potential-divider resistance which extends from the low voltage-reference terminal of the second IC chip to the input terminal of the second IC chip; and
   the potential-divider arrangement is configured such that:
   in a first case, a first current drawn from the high voltage-reference source of the first IC chip passes to the second IC chip via the high voltage-reference terminals and through the first potential-divider resistance, the first current then splitting into first and second parts with the first part of the first current passing back to the first IC chip via the output and input terminals and the second part of the first current passing back to the first IC chip via the low voltage-reference terminals; and
   in a second case, a second current drawn from the high voltage-reference source of the first IC chip splits into first and second parts within the first IC chip with the first part of the second current passing to the second IC chip via the high voltage-reference terminals and through the first potential-divider resistance and the second part of the second current passing to the second IC chip via the input and output terminals, and with a sum of the first and second parts of the second current passing back to the first IC chip via the low voltage-reference terminals.

2. The circuitry system of claim 1, wherein:
   the output-signal unit is a signal buffer, optionally comprising or being an inverter; and/or
   the high and low voltage-reference terminals of the first IC chip are respectively connected to the high and low voltage-reference terminals of the second IC chip so that the high and low voltage-reference sources of the first IC chip are respectively connected to the high and low voltage-reference terminals of the second IC chip as voltage-reference sources therefor; and/or
   current paths which pass through said potential-divider arrangement extend from the high voltage-reference source of the first IC chip to the low voltage-reference source of the first IC chip.

3. The circuitry system of claim 1, wherein the output-signal unit and potential-divider arrangement are configured or configurable such that the resistance they present between the high and low voltage-reference sources when the output signal has a logic low value and the resistance they present between the high and low voltage-reference sources when the output signal has a logic high value are substantially the same as one another.

4. The circuitry system of claim 1, wherein the output-signal unit is configured to present a first on resistance between the high voltage-reference source and the output terminal when the output signal has the logic high value and to present a second on resistance between the low voltage-reference source and the output terminal when the output signal has the logic low value, and wherein said first and second on resistances are substantially the same as one another.

5. The circuitry system of claim 1, wherein said first and second potential-divider resistances are substantially the same as one another.

6. The circuitry system of claim 1, wherein the output-signal unit is configured to output the output signal as a switched logic level signal such as a digital signal, which signal is optionally configured to switch between the voltages of the high and low voltage-reference sources.

7. The circuitry system of claim 1, wherein the output signal is a single-ended signal.

8. The circuitry system of claim 1, configured or configurable such that the output terminal of the first IC chip is connected to the input terminal of the second IC chip via a transmission line connection.

9. The circuitry system of claim 8, wherein:
the input impedance of the transmission line is equal to the on-resistances of the output-signal unit when the output signal has a logic low value and when the output signal has a logic high value; and/or
the first and second potential-divider resistances each have a resistance twice the input impedance of the transmission line.

10. The circuitry system of claim 1, configured or configurable such that the output signal is transmitted from the first IC chip to the second IC chip via only the single connection between the output terminal of the first IC chip and the input terminal of the second IC chip.

11. The circuitry system of claim 1, wherein:
the first IC chip comprises analogue-to-digital converter circuitry, the output signal is a digital signal output from the analogue-to-digital converter circuitry, and the second IC chip comprises digital circuitry configured to operate in dependence upon that digital signal; or
the first IC chip comprises digital circuitry, the output signal is a digital signal output from that digital circuitry, and the second IC chip comprises digital-to-analogue converter circuitry configured to operate in dependence upon that digital signal; or
the first IC chip comprises digital circuitry, the output signal is a digital signal output from that digital circuitry, and the second IC chip comprises digital circuitry configured to operate in dependence upon that digital signal.

12. The circuitry system of claim 1, wherein the first and second IC chips are configured or configurable such that they have a plurality of said output terminals and input terminals.

13. The circuitry system of claim 12, wherein the first and second IC chips are configured or configurable such that:
each said output terminal is connected to receive a corresponding output signal from a corresponding output-signal unit of the first IC chip;
each said output-signal unit is connected between said high and low voltage-reference sources of the first IC chip; and
each said input terminal is connected in a corresponding potential-divider arrangement between said high and low voltage-reference terminals of the second IC chip,
wherein each said output terminal of the first IC chip is connected to a corresponding said input terminal of the second IC chip for transmission of its corresponding output signal from the first IC chip to the second IC chip.

14. The circuitry system of claim 1 being or comprising a flip-chip package, wherein said first and second IC chips are flip chips of the flip-chip package.

15. Mixed-signal circuitry, comprising the circuitry system of claim 1.

16. A circuitry system comprising first and second IC chips, configured or configurable such that:
the first IC chip has an output terminal connected to receive an output signal from an output-signal unit of the first IC chip, the output-signal unit being connected between high and low voltage-reference sources of the first IC chip, the high and low voltage-reference sources being connected to respective high and low voltage-reference terminals of the first IC chip; and
the second IC chip has an input terminal connected in a potential-divider arrangement between high and low voltage-reference terminals of the second IC chip,
wherein:
the high and low voltage-reference terminals of the first IC chip are respectively connected to the high and low voltage-reference terminals of the second IC chip; and
the output terminal of the first IC chip is connected to the input terminal of the second IC chip for transmission of the output signal from the first IC chip to the second IC chip,
and wherein:
the output-signal unit and potential-divider arrangement are configured or configurable such that the resistance they present between the high and low voltage-reference sources when the output signal has a logic low value and the resistance they present between the high and low voltage-reference sources when the output signal has a logic high value are substantially the same as one another; or
the output-signal unit is configured to present a first on resistance between the high voltage-reference source and the output terminal when the output signal has the logic high value and to present a second on resistance between the low voltage-reference source and the output terminal when the output signal has the logic low value, and said first and second on resistances are substantially the same as one another; or
the potential-divider arrangement is configured or configurable to present a first potential-divider resistance between the high voltage-reference source and the input terminal and to present a second potential-divider resistance between the low voltage-reference source and the input terminal, and said first and second potential-divider resistances are substantially the same as one another.

17. A circuitry system comprising first and second IC chips, configured or configurable such that:
the first IC chip has an output terminal connected to receive an output signal from an output-signal unit of the first IC chip, the output-signal unit being connected between high and low voltage-reference sources of the first IC chip, the high and low voltage-reference sources being connected to respective high and low voltage-reference terminals of the first IC chip; and
the second IC chip has an input terminal connected in a potential-divider arrangement between high and low voltage-reference terminals of the second IC chip,
wherein:
the high and low voltage-reference terminals of the first IC chip are respectively connected to the high and low voltage-reference terminals of the second IC chip; and
the output terminal of the first IC chip is connected to the input terminal of the second IC chip for transmission of the output signal from the first IC chip to the second IC chip,
and wherein:
the circuitry system is configured or configurable such that the output terminal of the first IC chip is connected to the input terminal of the second IC chip via a transmission line connection; and
the input impedance of the transmission line is equal to the on-resistances of the output-signal unit when the output signal has a logic low value and when the output signal has a logic high value, and/or the first and second potential-divider resistances each have a resistance twice the input impedance of the transmission line.

* * * * *